(12) United States Patent
Finkler

(10) Patent No.: US 11,662,226 B2
(45) Date of Patent: May 30, 2023

(54) SENSOR DEVICE WITH SYNCHRONIZATION OF A SENSOR SIGNAL WITH A REQUEST SIGNAL

(71) Applicant: Siemens Aktiengesellschaft, Munich (DE)

(72) Inventor: Roland Finkler, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 462 days.

(21) Appl. No.: 16/997,604

(22) Filed: Aug. 19, 2020

(65) Prior Publication Data

US 2021/0058089 A1   Feb. 25, 2021

(30) Foreign Application Priority Data

Aug. 20, 2019   (EP) .................................. 19192531

(51) Int. Cl.
*G01D 5/244* (2006.01)
*G01D 5/24* (2006.01)
*G01P 15/125* (2006.01)
*H03L 7/00* (2006.01)
*G01D 5/241* (2006.01)

(52) U.S. Cl.
CPC ........... *G01D 5/24476* (2013.01); *G01D 5/24* (2013.01); *G01P 15/125* (2013.01); *H03L 7/00* (2013.01); *G01D 5/2415* (2013.01)

(58) Field of Classification Search
CPC .................................................. G01D 5/24476
USPC ....................................................... 73/514.32
See application file for complete search history.

(56) References Cited

U.S. PATENT DOCUMENTS

| 5,317,614 | A | 5/1994 | Davis et al. |
| 5,978,436 | A | 11/1999 | Lohse et al. |
| 7,154,343 | B2 * | 12/2006 | Okuda .................... H03L 7/091 331/16 |
| 2008/0027619 | A1 | 1/2008 | Aspelmayr et al. |

(Continued)

FOREIGN PATENT DOCUMENTS

| CN | 1969117 A | 5/2007 |
| CN | 105806201 A | 7/2016 |
| DE | 43 31 226 A1 | 3/1995 |

(Continued)

*Primary Examiner* — Walter L Lindsay, Jr.
*Assistant Examiner* — Philip T Fadul
(74) *Attorney, Agent, or Firm* — Henry M. Feiereisen LLC

(57) ABSTRACT

A sensor device has a clock generator, a counter, an exciter device, a sensor element and an evaluation device, and outputs a sensor signal in response to a request signal having alternating leading and trailing edges. The counter reading is incremented differently, depending on whether the request signal has a leading/trailing edge between two successive leading or trailing edges of the clock signal. If the request signal has such a leading/trailing edge the counter corrects the counter reading. The value of the excitation signal outputted by the exciter device depends on the counter reading or a value derived therefrom. The sensor element outputs based on the excitation signal a raw signal, which is supplied to the evaluation device. The evaluation device determines based on this information whether to acquire the raw signal and how to take the raw signal into account when establishing the sensor signal.

15 Claims, 6 Drawing Sheets

(56) References Cited

U.S. PATENT DOCUMENTS

2016/0209242 A1 7/2016 Adachi et al.

FOREIGN PATENT DOCUMENTS

| EP | 2 787 644 A1 | 10/2014 |
| EP | 2 916 107 A1 | 9/2015 |

* cited by examiner

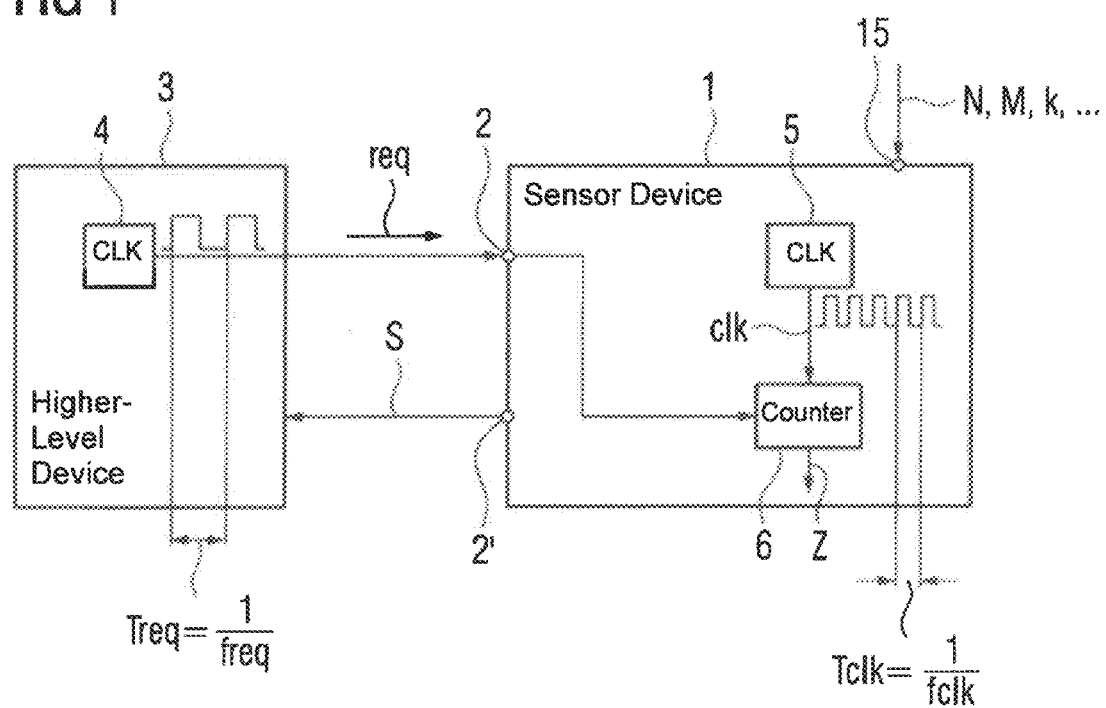

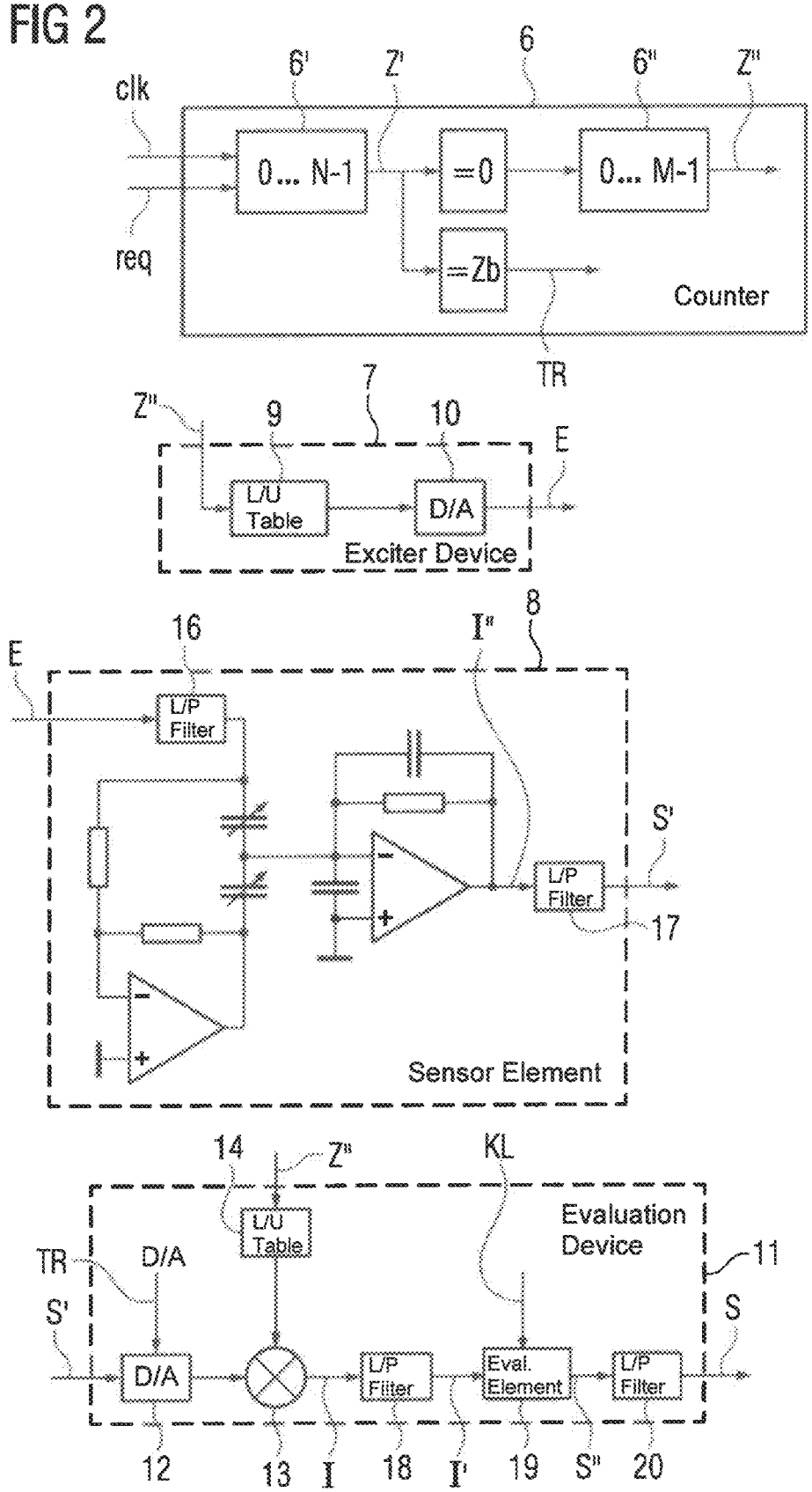

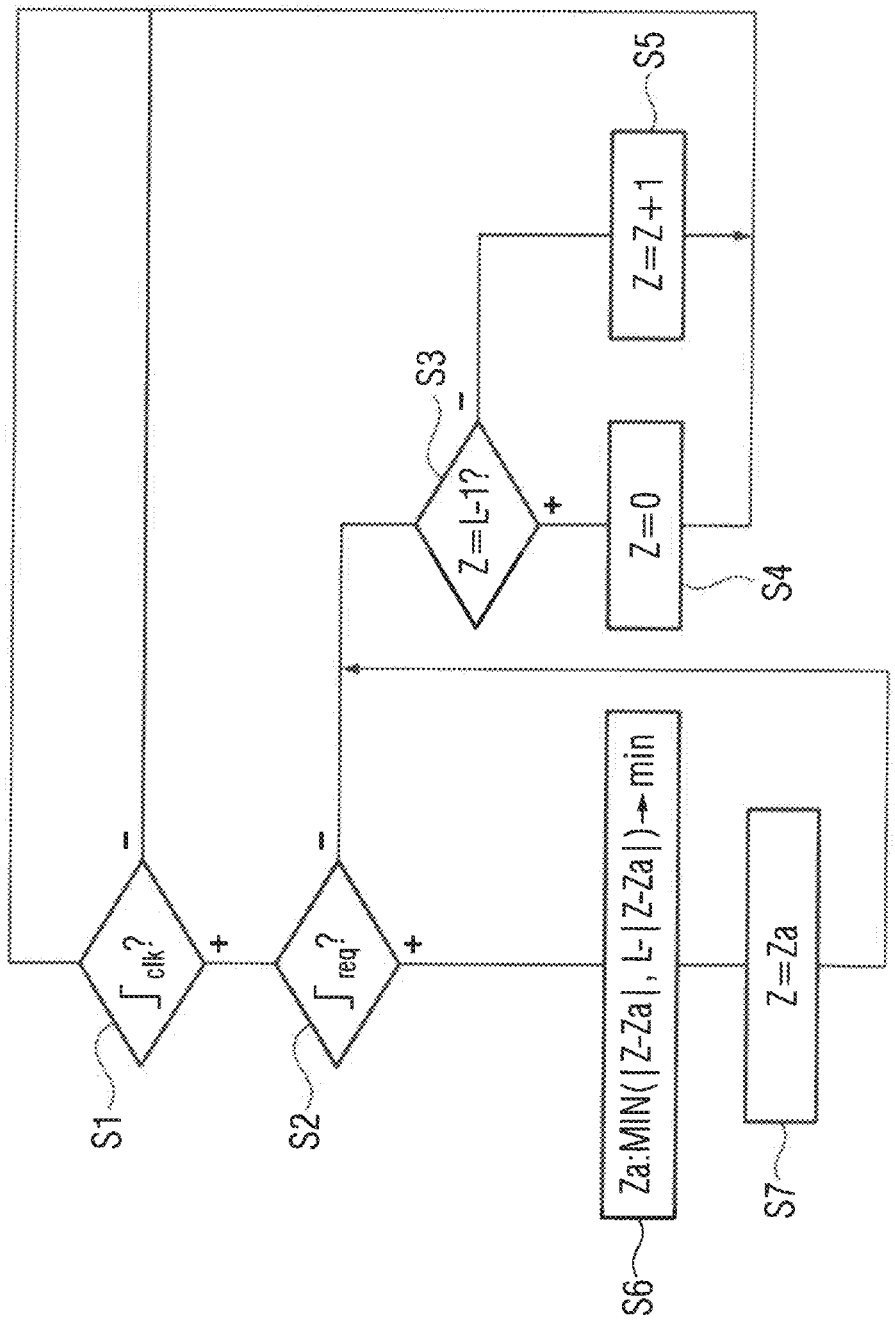

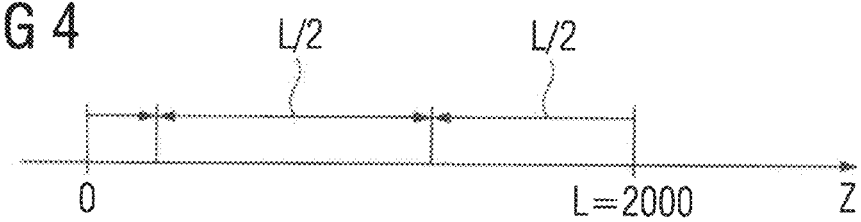
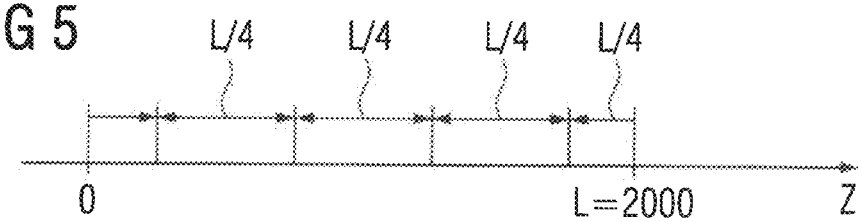
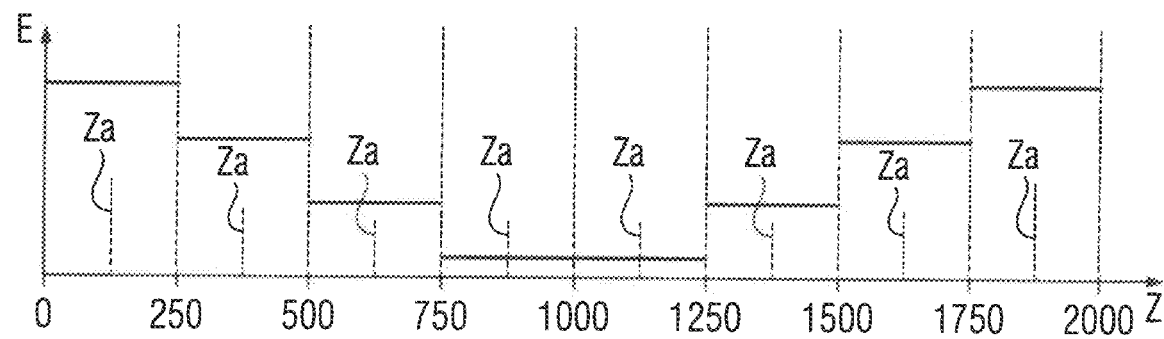

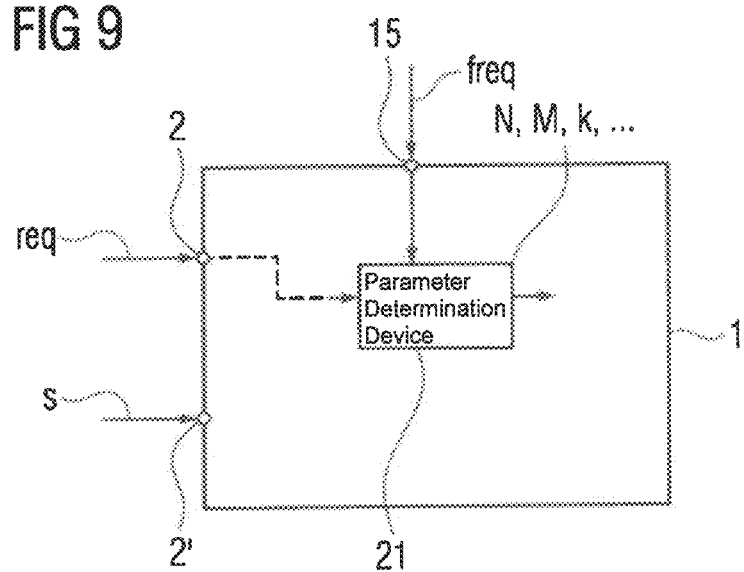

SENSOR DEVICE WITH SYNCHRONIZATION OF A SENSOR SIGNAL WITH A REQUEST SIGNAL

CROSS-REFERENCES TO RELATED APPLICATIONS

This application claims the priority of European Patent Application 19192531.2, filed Aug. 20, 2019 pursuant to 35 U.S.C. 119(a)-(d), the content of which is incorporated herein by reference in its entirety as if fully set forth herein.

BACKGROUND OF THE INVENTION

The present invention relates to a sensor device with synchronization of a sensor signal with a request signal.

The following discussion of related art is provided to assist the reader in understanding the advantages of the invention, and is not to be construed as an admission that this related art is prior art to this invention.

In many sensor devices, the time sequence of raw signal acquisition is based on a basic cycle clock, which is generated within the sensor device by means of a clock generator. The clock generator oscillates at a high frequency, which may amount to 100 MHz or more. A resultant sensor signal is repeatedly requested by a higher-level device, or example an open-loop control device for a drive. The higher-level open-loop control device supplies a corresponding digital request signal to the sensor device for this purpose. Supply of the request signal also proceeds in clocked manner. However, the request signal has a markedly lower frequency of for example 8 kHz or 16 kHz. The two clocks, i.e. the basic cycle clock of the clock generator within the sensor device and the clock of the externally supplied request signal, often run asynchronously with one another.

In the simplest case, the sensor device outputs the last internally generated value as a resultant sensor signal.

As a result of asynchronicity, this procedure leads to the resultant sensor signal having a variable dead time relative to the request signal on the basis of which it is output to the higher-level device. In this case, the situation may arise in practice that the value of the dead time rises from request to request starting from a specific value in the case of a specific request until the dead time reaches a maximum value. The dead time then jumps abruptly to the minimum value and then gradually continues to increase again. The opposite situation may also arise. The period with which the jumps arise in the dead time may be 100 ms or greater. The jump in the dead time from the maximum value to the minimum value or vice versa may be critical and may in particular bring about slight disturbances in control accuracy, which the higher-level device undertakes for example in the case of a drive controlled by the higher-level device.

It would therefore be desirable and advantageous to obviate prior art shortcomings and to provide an improved sensor device wherein a counter reading can be synchronized with a request clock of an externally supplied request signal. Synchronization should preferably be possible using purely digital means. In particular, an analog-operating phase-locked loop should be avoided.

SUMMARY OF THE INVENTION

According to one aspect of the present invention, a sensor device has a signal connection receiving from a higher-level device a digital request signal with alternating leading and trailing edges, and outputting to the higher-level device in response the received digital request signal via the signal connection or via another signal connection a resultant sensor signal. The sensor device further includes a clock generator outputting a digital basic signal with a basic frequency and alternating leading and trailing edges, and a counter receiving the digital basic signal and the digital request signal and outputting a counter reading. When the digital request signal has no leading edge or trailing edge located between two directly successive leading or trailing edges of the digital basic signal, the counter increments the counter reading modulo a modulo value, whereas when the digital request signal has a leading or trailing edge located between two directly successive leading or trailing edges of the digital basic signal, the counter corrects the counter reading, prior to or after incrementation of the counter reading, by a distance between the counter reading and a particular counter reading that is closest to the counter reading, with the particular counter reading belonging to a true subset of possible counter readings. In addition, the sensor device includes an exciter device which receives the counter reading or a value derived therefrom and determines, based on the respective counter reading or the value derived therefrom, a value of an excitation signal; and outputs the excitation signal to a sensor element which outputs a raw signal based on the excitation signal. Lastly, the sensor device includes an evaluation device which receives the raw signal and the counter reading or the value derived therefrom and determines, based on the counter reading or the value derived therefrom, whether to capture the raw signal and how to take the captured raw signal into account when determining the resultant sensor signal.

The number of particular counter readings may be determined as required. In particular, it may be equal to 1 or greater than 1. A number of 1 may in particular be appropriate if the quotient of the request period and the base period is sufficiently exactly equal to an integral multiple of the number of possible counter readings.

If the excitation signal output by the exciter device to the sensor element, based on the sequence of counter readings, has in each case a constant value during successive, internally coherent sections of counter readings, it is preferably provided that

- the sections of counter readings in each case comprise at least approximately the same number of counter readings,
- the number of sections is an integral multiple of the number of particular counter readings, in particular is equal to the number of particular counter readings, and
- the particular counter readings lie approximately in the middle of the respective section.

It may in this way in particular be ensured that the optionally necessary correction of the counter reading is not immediately and directly associated with a modification of the excitation signal. This simplifies stable operation of the sensor device.

Preferably, the evaluation device acquires the raw signal solely during specific counter readings, wherein the specific counter readings are preferably remote from the boundaries of successive sections. This procedure in particular makes it possible to prevent acquisition of the raw signal in the vicinity of the transient state when modifying the excitation signal. This may be advantageous in particular for EMC reasons and for reasons of accuracy of the acquired raw signal.

In many cases, it is advantageous for the modulo value to be equal to the product of a first and a second integer, wherein the first integer is equal to the number of successive counter readings during which the excitation signal in each case has a constant value. Corresponding thereto, the second integer is equal to the number of sections of successive counter readings during which the excitation signal in each case has a constant value. It is possible for the first and second integer to be fixedly specified to the sensor device. Preferably, however, the sensor device has a parameterization input, via which the first and second integers are specifiable to the sensor device after production of the sensor device, in particular on commissioning of the sensor device. In this way, the stated numbers may be specified to the sensor device as required.

If the sensor device has a parameterization input, it may alternatively or additionally be possible, for specification of the stated numbers, for the number of specific counter readings to be specifiable to the sensor device after production of the sensor device, in particular on commissioning of the sensor device, via the parameterization input.

Likewise, it may alternatively or additionally be possible, for specification of the stated numbers and/or the number of particular counter readings, for at least one operating parameter of the exciter device and/or of the sensor element and/or of the evaluation device to be specifiable after production of the sensor device, in particular on commissioning of the sensor device, via the parameterization input. In this way, the mode of operation of the sensor device may be matched, as required, to the circumstances of the specific application.

For all parameterization possibilities, it is always the case that equivalent specified values are also possible. It is for example possible, instead of the first and second integer, to specify one of these two numbers and the product of these two numbers. Similar explanations apply to the other possible parameters.

As an alternative to explicit specification of parameters, it is possible for the sensor device to have a parameter determination device, by means of which the sensor device automatically establishes at least one operating parameter of the sensor device on the basis of the request frequency. This operating parameter or these operating parameters may be one or more of the above-stated parameters. This procedure is an alternative, with regard to one individual parameter, to specification of the corresponding parameter via a parameterization input. Viewed over all the parameters as a whole, however, a mixed procedure is also possible, thus with at least one of the parameters being specified via the parameterization input and at least one other of the parameters being automatically established by the sensor device on the basis of the request frequency.

Finally, it is possible for the request frequency to be specifiable as such for the sensor device via the parameterization input after production of the sensor device, in particular on commissioning of the sensor device. It is alternatively also possible for the request signal to be supplied to the parameter determination device within the sensor device and for the parameter determination device automatically to establish the request frequency on the basis of the request signal.

On the basis of the circumstance that the exciter device determines on the basis of the respective counter reading what value the excitation signal has in each case, the excitation signal is periodic, based on the sequence of counter readings, with the modulo value. The excitation signal preferably oscillates, based on the sequence of counter readings, with the fundamental component or a higher harmonic oscillation, or the fundamental component or the higher harmonic oscillation determines at least the dominant component of the excitation signal. As a rule, the fundamental component is in this case preferable. However, situations are also conceivable in which a harmonic oscillation is advantageous.

This is because, for optimum operation of the sensor element, it is often advantageous for the excitation signal to be exactly or at least approximately sinusoidal and for the frequency of the, optionally approximated, sinusoidal oscillation to lie within a specific frequency range. In some cases, for example in the case of acceleration sensors, it is moreover advantageous for the frequency of the sinusoidal oscillation to be as far as possible exactly one integral multiple of the request frequency (wherein identity with the request frequency should also be included).

The following example should be considered, with regard to motivation to use a higher harmonic for the excitation signal or the dominant component of the excitation signal:

It is assumed that the sensor element is an acceleration sensor, for which it is advantageous for the excitation signal to be approximately sinusoidal with a frequency of between 20 kHz and 40 kHz and this frequency moreover to be an integral multiple of the request frequency. If, for example, the basic frequency amounts to 50 MHz and the request frequency amounts to 8 kHz and consequently the base period and the request period amount to 20 ns and 125 µs, a favorable frequency (excitation frequency) and period (excitation period) for the excitation signal are 32 kHz and 31.25 µs respectively.

With these values, the quotient of the excitation period and the base period, being 31.25 µs/20 ns=1562.5, is not integral. Nevertheless, an excitation signal may be generated starting from the counter readings which (based on the time) is approximately periodic with the excitation period if a modulo value is assumed which is equal to twice the quotient of excitation period and base period, and forms for the excitation signal for example 25 sections each of 125 counter readings (25×125=3125). The excitation signal for the i-th section (where i=1, 2, . . . , 25) may in this case for example be determined at E0 cos(2*2*pi*(i−1)/25), wherein E0 is an amplitude which is in principle freely selectable.

However, the same result may also be achieved, in a very close approximation, when using the fundamental component. In this case, a different value may for example be assumed for the excitation period, for example a value smaller by 10 ns, i.e. of 31.24 µs. In this case, the excitation frequency is admittedly no longer exact, but is, with sufficient accuracy, an integral multiple of the request frequency. Moreover, the quotient of the excitation period and the base period, at 1562, is now integral. In this case, this value may likewise be selected as modulo value. For the excitation signal, 12 sections may for example be provided in this case, of which the first and the seventh in each case comprise 131 counter readings and the other sections in each case comprise 130 counter readings. The excitation signal for the i-th section (where i=1, 2, . . . , 25) may in this case for example be determined at E0 cos(2*pi*(i−1)/12), wherein E0 is again an amplitude which is in principle freely selectable.

In some cases, an embodiment of the sensor device is advantageous in which the evaluation device, calculated from the last requested resultant sensor signal, establishes a provisional sensor signal for in each case a number of counter readings,
the just stated number of counter readings is equal to the modulo value,
the evaluation device establishes the respective provisional sensor signal in that it initially establishes an intermediate signal on the basis of the raw signals and establishes the respective provisional sensor signal on the basis of the respective intermediate signal, using a non-linear characteristic curve, and the evaluation device establishes the resultant sensor signal as an average of the provisional sensor signals established since the last requested resultant sensor signal.

This procedure may in particular be appropriate when the provisional and resultant sensor signals represent acceleration of the sensor element. In particular, acceleration is often used to establish velocity through subsequent integration. Velocity can be established more accurately by the stated procedure. In addition, aliasing effects are suppressed or at least reduced.

The sensor element may in particular be embodied as a sensor element operating on a capacitive basis, for example as a capacitive position encoder or as a capacitive acceleration sensor.

BRIEF DESCRIPTION OF THE DRAWING

Other features and advantages of the present invention will be more readily apparent upon reading the following description of currently preferred exemplified embodiments of the invention with reference to the accompanying drawing, in which:

FIG. 1 shows a sensor device and a higher-level device,
FIG. 2 shows details of the sensor device of FIG. 1,
FIG. 3 shows a flowchart,
FIGS. 4 and 5 show counter readings,
FIG. 6 shows counter readings and an excitation signal,
FIG. 9 shows a further detail of the sensor device of FIG. 1.

DETAILED DESCRIPTION OF PREFERRED EMBODIMENTS

Figure 7:
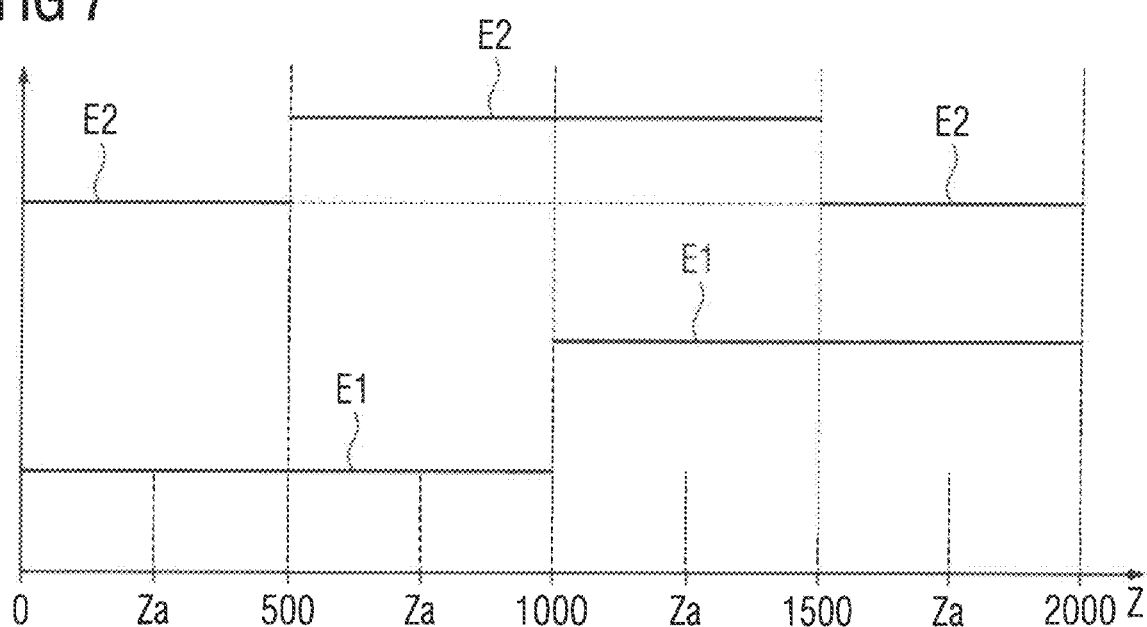
FIG. 7 shows counter readings and multiple excitation signals.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a sensor device 1 having a signal connection 2. A request signal req is supplied from a higher-level device 3 to the sensor device 1 via the signal connection 2. The request signal req is a digital signal. It has alternating leading and trailing edges as shown in the representation in FIG. 1. The time interval between each pair of directly successive leading edges of the request signal req is hereinafter designated request period and provided with the reference sign Treq.

With each leading edge, the higher-level device 3 requests a resultant sensor signal S from the sensor device 1. The sensor device 1 thus outputs the resultant sensor signal S to the higher-level device 3 in response to supply of the digital request signal req. Output to the higher-level device 3 may, depending on how communication between the sensor device 1 and the higher-level device 3 is configured, proceed via the signal connection 2 or another signal connection 2' of the sensor device 1.

As an alternative to the sensor signal S being requested with each leading edge of the digital request signal req, the sensor signal S could also be requested with each trailing edge of the digital request signal req. In exceptional cases, it is even possible for the sensor signal S to be requested both with every leading and every trailing edge of the digital request signal req. It is assumed below, in accordance with conventional practice, that the sensor signal S is requested with every leading edge of the digital request signal req.

The request signal req is generated within the higher-level device 3 by means of a clock generator 4. The clock generator 4 is generally quartz-controlled and thus highly precise. A request frequency freq of the request signal req, i.e. the value 1/Treq, is generally in the low or medium kilohertz range. The request frequency may for example be approx. 4 kHz, 8 kHz, 16 kHz or 32 kHz.

The sensor device 1 likewise has, see in addition FIG. 2, a clock generator, hereinafter designated with reference sign 5. The clock generator 5 outputs a basic signal clk with a basic frequency fclk. The clock generator 5 is generally likewise quartz-controlled and thus highly precise. The basic signal clk is likewise a digital signal. It thus has alternating leading and trailing edges. The time interval between each pair of directly successive leading edges of the basic signal clk is hereinafter designated base period and provided with the reference sign Tclk. The basic frequency fclk is as a rule much greater than the request frequency freq. The basic frequency fclk may for example be 120 MHz. The associated base period Tclk=1/fclk is 8.33 ns in this example.

The sensor device 1 further comprises a counter 6. The basic signal clk and the request signal req are supplied to the counter 6. The counter 6 outputs a counter reading Z as a function of the basic signal clk and the request signal req. The mode of operation of the counter 6 constitutes the essential subject matter of the present invention and will be explained in greater detail below with reference to FIG. 3.

According to FIG. 3, the counter 6 checks in a step S1 whether a leading edge of the basic signal clk has occurred since the previous execution of step S1. If this is not the case, the counter 6 returns to step S1. If, on the other hand, this is the case, the counter 6 moves on to a step S2.

As an alternative to checking the basic signal clk for the occurrence of a leading edge, a check could also be carried out for the occurrence of a trailing edge of the basic signal ck. In exceptional cases, it is even possible for the basic signal clk to be checked for the occurrence of both a leading and a trailing edge. Conventional practice is assumed below, i.e. that basic signal clk is checked for the occurrence of a leading edge.

If a leading edge of the basic signal clk has occurred, the counter 6 checks in step S2, whether a leading edge of the request signal req has occurred since the previous execution of the step S2. If this is not the case, the counter 6 moves on to a step S3.

In step S3, the counter 6 checks whether the counter reading Z has a value L−1. If such is the case, in a step S4 the counter 6 sets the counter reading Z to the value 0. Otherwise, in a step S5, the counter 6 increases the counter reading Z by 1. From step S4 or S5 the counter 6 goes back to step S1. In the course of repeated execution of steps S1 to S5, the counter 6 thus increments the counter reading Z. However, incrementation proceeds modulo L. The counter 6 thus counts from 0 to 1, from 1 to 2, from 2 to 3 etc. to up to from L−2 to L−1. L−1 is followed again by 0. L is thus a modulo value or the number of mutually different counter readings Z. The modulo value L may have a higher, two-digit, three-digit or even four-digit value, for example the value 80, the value 400 or the value 2000.

If the counter 6 identifies in step S2 that, since the previous execution of step S2, a leading edge of the request signal req has occurred, the counter 6 moves to a step S6. In step S6, the counter 6 establishes that one of a number of particular counter readings Za in which the distance from the current counter reading Z is minimal.

For example, the counter 6 may establish the number of leading edges of the basic signal clk which are needed in order to count from a specific particular counter reading Za to the current counter reading Z. In the context of this determination, it is assumed that no leading edge of the request signal req occurs. Furthermore, the counter 6 may establish the number of leading edges of the basic signal clk which are needed to count from the current counter reading Z to the same specific particular counter reading Za. It is also assumed in the context of this determination that no leading edge of the request signal req occurs. The smaller one of these two values corresponds to the distance between this particular counter reading Za and the current counter reading Z. This procedure can then be undertaken for all the particular counter readings Za. This makes it simple to determine the closest particular counter reading Za.

Then, in a step S7, the counter 6 sets the counter reading Z to the value established in step S6, i.e. to the corresponding particular counter reading Za. The counter reading Z is thus corrected in the result by the distance between the counter reading Z and the nearest of a number of particular counter readings Za. From step S7, the counter 6 then moves to step S3.

When determining the stated distance, the modulo L count should be taken into account. If therefore, purely by way of example, the modulo value L is 2000 and four particular counter readings Za are defined which are 100, 600, 1100 and 1600, and furthermore the counter reading Z currently has the value 1900, the closest particular counter reading Za is that with the value 100. This because this particular counter reading Za has a distance of only 200 from the current counter reading Z, while in the particular counter reading Za with the value 1600 the distance is 300.

In the context of the procedure explained above in relation to FIG. 3, the counter reading Z is corrected before incrementation of the counter reading Z. Alternatively, however, the counter reading Z could likewise be corrected after incrementation of the counter reading Z. In this case, step S1 would be followed directly by step S3 and then one of steps S4 and S5. On the other hand, step S2 would have to follow steps S4 and S5, wherein the procedure returns to step S1 directly in the NO branch of step S2 and after execution of steps S6 and S7 in the YES branch of step S2.

The procedure explained above in relation to FIG. 3 is only appropriate when the particular counter readings Za are a true subset of the possible counter readings Z, the number k of particular counter readings Za thus being less than the modulo value L. As a rule, the number k of particular counter readings Za is less than the modulo value L by at least one order of magnitude (=factor 10). In general, the number k of particular counter readings Za is in the one-digit or low two-digit range, for example 4 or 8.

It is often favorable for the number k of particular counter readings Za to be set as the smallest common multiple of the quotient of the product of modulo value L and the base period Tclk divided by the request period on the one hand and the value 1 on the other hand or an integral multiple of this value. Thus, if the value of k' is as follows $$k'=kgV(LT\text{clk}/T\text{req},1),$$

the number k of particular counter readings Za is either k' or 2k' or 3k' etc.

Since the base period Tclk is considerably shorter than the request period Treq, the counter 6 is thus as a rule incremented modulo L with the basic frequency fclk. One exception, however, is the case in which precisely one leading edge of the request signal req was acquired. In this case, before or after incrementation of the counter reading Z, the counter reading Z is corrected by the distance between the counter reading Z and the next particular counter reading Za.

As a rule, both the request frequency freq and the basic frequency fclk are determined by a respective clock generator 4, 5, which very precisely establishes the respective frequency freq, fclk. If the modulo value of L and the particular counter readings Za are matched suitably to the frequencies freq, fclk, the counter reading Z is therefore only corrected by small amounts, apart from in the case of the initial correction at the start. In favorable cases, the counter reading Z will even from time to time be corrected by −1 or +1. If it is necessary to correct the counter reading Z by more than 1, this correction may either take place immediately in its entirety or be distributed over a plurality of counting steps of the counter reading Z. Corresponding modification of the flowchart is straightforwardly possible for persons skilled in the art.

The mode of operation of the counter 6 was explained above in the form of a sequential procedure. In practice, however, the counter 6 often takes the form of a hardware circuit. The mode of operation is in this case fixed by the various elements of the counter 6, depending on their nature. In this case, on the other hand, the counter 6 does not run a software program.

The sensor device 1 additionally has an exciter device 7. The exciter device 7 outputs an excitation signal E to a sensor element 8 of the sensor device 1. The excitation signal E may for example be an electrical voltage or an electrical current. For the sake of good order, it should be mentioned at this point that the term "excitation signal" is used in a generic sense, such that a plurality of excitation signals E may thus also be optionally generated by the exciter device 7.

The counter 6 may supply the respective counter reading Z as such to the exciter device 7. The exciter device 7 may in this case determine, on the basis of the respective counter reading Z, what value the excitation signal E has in each case. Alternatively, the counter 6 of the exciter device 7 may derive a value on the basis of the counter reading Z and supply the derived value to the exciter device 7. In this case, the exciter device 7 thus determines the excitation signal E on the basis of the derived value.

In particular, the counter 6 may internally have a first and a second counter 6',6", hereinafter designated sub-counters. The two counters 6',6" in each case have a counter reading Z' of 0, 1, etc. up to N−1 or a counter reading Z" of 0, 1, etc. up to M−1.

The first sub-counter 6' in this case performs a count from 0 to 1, then to 2 etc. up to a value N−1 and thence back to 0 with every leading edge of the basic signal clk. The first sub-counter 6' thus increments modulo N. One exception, however, is if a leading edge of the request signal req has occurred since the previous leading edge of the basic signal clk. In this case, the counter reading Z' is corrected by the distance to the next of a number of further particular counter readings Za'. The particular counter readings Za' are in this case a true subset of the possible counter readings Z' of the sub-counter 6'. The number of particular counter readings Za' of the first sub-counter 6' may be equal to 1 or greater than 1. The above explanations are applicable mutatis mutandis to correction of the counter reading Z. In this case, for the particular counter readings Za related to the counter reading Z, the following applies $$Za = Mn + Za' \text{ with } m = 0, 1, \text{etc. up to } M-1$$

Every time that the first sub-counter 6' assumes the value 0, the second sub-counter 6" Increments by 1, i.e. from 0 to 1, then on to 2 etc. up to a value M−1 and thence back to 0. The second sub-counter 6" thus increments modulo M.

The product of the two natural numbers N, M corresponds in this case to modulo value L. The counter reading Z of the counter 6 thus results in Z'+NZ". Specifically, the counter 6 supplies the counter reading Z" as a derived value to the exciter device 7 in accordance with the depiction in FIG. 2.

In the embodiment according to FIG. 2, the output signal Z" of the second sub-counter 6" is thus constant during in each case N directly successive counter readings Z. At this point, the statement "directly successive counter readings Z" does not relate to the time sequence but rather to the sequence within the sequence of possible counter readings Z. Since the exciter device 7 establishes the excitation signal E in the embodiment according to FIG. 2 on the basis of the counter reading Z" of the second sub-counter 6", in the embodiment according to FIG. 2 the excitation signal E thus in each case has a constant value during in each case N directly successive counter readings Z. The value can only change if the counter reading Z of the second sub-counter 6" changes.

The respective counter reading Z (or the value derived therefrom) thus uniquely defines which excitation signal E is output to the sensor element 8. Corresponding to the specific depiction in FIG. 2, a respective digital value is taken, as a function of the counter reading Z" of the second sub-counter 6", from a first look-up table 9, which digital value is converted via a digital/analog converter 10 into a corresponding analog value. The analog value is supplied to the sensor element 8.

The sensor element 8 may operate on a capacitive basis. This is apparent in the depiction in FIG. 2 from the depiction of the variable capacitors. The sensor element 8 may for example be embodied as a capacitive position encoder or as a capacitive acceleration sensor. Irrespective of whether or not the sensor element 8 operates on a capacitive basis, the sensor element 8 outputs a raw signal S' on the basis of the excitation signal E. For the sake of good order, it should be mentioned at this point that the term "raw signal" is used in the generic sense, such that a plurality of raw signals S' may thus optionally also be generated by the sensor element 8, for example a sine and a cosine signal in the case of a position encoder. The circuit, illustrated specifically in FIG. 2, of the sensor element 8 is moreover of subordinate significance. It may thus also be embodied in another manner.

The sensor element 8 supplies the raw signal S' to an evaluation device 11, which is likewise a component of the sensor device 1. The respective counter reading Z or, as shown in FIG. 2, at least one value derived therefrom is likewise supplied to the evaluation device 11. The derived value may be identical to the value supplied to the exciter device 7. This is not absolutely essential, however. On the basis of the respective counter reading Z or the value derived therefrom, the evaluation device 11 determines whether it detects the raw signal S' and in what way it takes account of the respectively acquired raw signal S' from determination of the resultant sensor signal S.

For example, in accordance with the specific depiction in FIG. 2, the evaluation device 11 may digitize the raw signal S' in an analog-digital converter 12 and then multiply it in a multiplier 13 with a weighting factor. The product corresponds to an intermediate signal I. In accordance with the specific depiction in FIG. 2, the evaluation device 11 may take the weighting factor from a second lookup table 14 as a function of the counter reading Z". The respective counter reading Z thus clearly establishes how a respectively acquired raw signal S' is incorporated into establishing the resultant sensor signal S.

The counter 6 additionally in each case outputs a trigger signal TR to the evaluation device 11 in the case of specific counter readings Zb. Whenever the counter 6 outputs a trigger signal TR, the analog-digital converter 12 outputs a new value of the raw signal S'. The respective counter reading Z thus also uniquely establishes when, if at all, and thus whether a raw signal S' is acquired.

In the embodiment according to FIG. 2, in which the two sub-counters 6',6" are used, the particular counter readings Za' related to the counter reading Z' are sufficiently remote from 0, N−1 and the specific counter readings Zb. The reason for this is that a correction of the counter reading Z or of the counter reading Z' should be possible on the basis of a leading edge of the request signal req without triggering additional counting operations of the second counter 6" and without triggering additional trigger signals TR.

The trigger signal TR is preferably additionally also output to the exciter device 7 and triggers this and the evaluation unit 11 as a whole, i.e. not only the analog-digital converter 12 contained therein, such that the exciter device 7 and the evaluation unit 11 are always only active when the trigger signal TR is output. At the corresponding times, then, the respective input signal Z" or S' and Z" are evaluated, the described signal processing executed and the respective output signals E or S output and retained until the next output on the basis of the next trigger signal TR.

The number k of particular counter readings Za may be 1. This may be particularly appropriate when the quotient of the request period Treq and the base period Tclk is sufficiently precisely equal to an integral multiple of the number L of possible counter readings Z, i.e. when Treq/Tclk=IL applies with sufficient accuracy, wherein I is a natural number. The number k of particular counter readings Za may however likewise also be greater than 1. This may be appropriate in particular when the quotient of the request period Treq and the base period Tclk is not sufficiently precisely equal to an Integral multiple of the number L of possible counter readings Z. In this case, the particular counter readings Za are generally distributed as uniformly as possible over the possible counter readings Z. In the case of k particular counter readings Za, the particular counter readings Za thus are, where possible, at a distance of L/k from one another. Slight deviations are not critical, however. In the case, for example, of a modulo value L of 2000 and a number k of particular counter readings Za of for example 2 (see FIG. 4) or 4 (see FIG. 5), the particular counter readings Za thus, in accordance with the depictions in FIGS. 4 and 5, are preferably at a distance of 2000/2=1000 (or of 2000/4=500) or in general of L/2 or L/4 from one another.

As already mentioned, the excitation signal E does not vary within a respective section of N directly successive counter readings Z. The associated number M of sections is L/N. Preferably, the number M of sections is an integral multiple of the number k of particular counter readings Za. Preferably, M=mk thus applies, wherein m is a natural number. If, for example, the number M of sections thus amounts to 8, the number k of particular counter readings Za is preferably 1, 2, 4 or 8. Furthermore, the particular counter readings Za preferably lie roughly in the middle of the respective section. This is depicted in FIG. 6.

Therefore if, for example, the modulo value L has the value 2000 and the excitation signal E for counter readings Z from 0 to 249, from 250 to 499, from 500 to 749 etc. in each case has a constant value, in the case of 8 particular counter readings Za the particular counter readings Za should be around 125, 375, 625 etc. In the case of four particular counter readings Za, every second one of the eight stated counter readings Za is omitted. For example, the remaining particular counter readings Za are then 125, 625, 1125 and 1625. In the case of two particular counter readings Za, in each case three successive ones of the eight stated counter readings Za are omitted. For example, the remaining particular counter readings Za may then be 125 and 1125.

As already mentioned, it is possible for the exciter device 7 to output a plurality of excitation signals E. In this case, each of the output excitation signals E in the respective section is constant. In this case, the sections are thus defined in such a way that none of the excitation signals E varies within the respective section. This is explained in greater detail below in relation to FIG. 7 for the case of two excitation signals—hereinafter designated E1 and E2. The principle can, however, also be straightforwardly extended to still more excitation signals E.

If, for example, the modulo value L has the value 2000, the one excitation signal E1 has a first value for counter readings Z from 0 to 999 and a second value for counter readings Z from 1000 to 1999 and moreover the other excitation signal E2 has a third value for counter readings Z from 500 to 1499 and a fourth value for counter readings Z from 1500 to 1999 and from 0 to 499, four sections are formed in total, namely from 0 to 499, from 500 to 999, from 1000 to 1499 and from 1500 to 1999. In this way, it is then possible for example also for 1, 2 or 4 particular counter readings Za to be defined which in the case of 4 particular counter readings Za are preferably around 250, 750, 1250 and 1750.

If a correction of the counter reading Z by more than 1 is necessary in an individual case (cf. step S7 in FIG. 2) and this correction is distributed to a plurality of counting steps of the counter reading Z, the correction may furthermore in particular be distributed to the sections, for example correction by +1 or −1 may take place in each of the sections until the correction is complete.

It is also apparent from FIG. 6 that the excitation signal E, based on the sequence of the counter readings Z, is periodic with the modulo value L. Based on the sequence of the counter readings Z, it may oscillate with the (sinusoidal) fundamental component. As an alternative, it may be a rectangular signal with a plus to minus pulse-duty factor of 1:1. Other signal curves are also possible. In any event, the (sinusoidal) fundamental component (or a higher harmonic) should however determine the dominant component of the excitation signal E.

The stated circumstances are also valid for a case in which the exciter device 7 outputs a plurality of excitation signals E1, E2. In this case, the stated comments apply to each Individual excitation signal E1, E2. For example, in accordance with the depiction in FIG. 7, the two excitation signals E1, E2 may in each case be rectangular signals with a plus to minus pulse-duty factor of 1:1.

Figure 8:
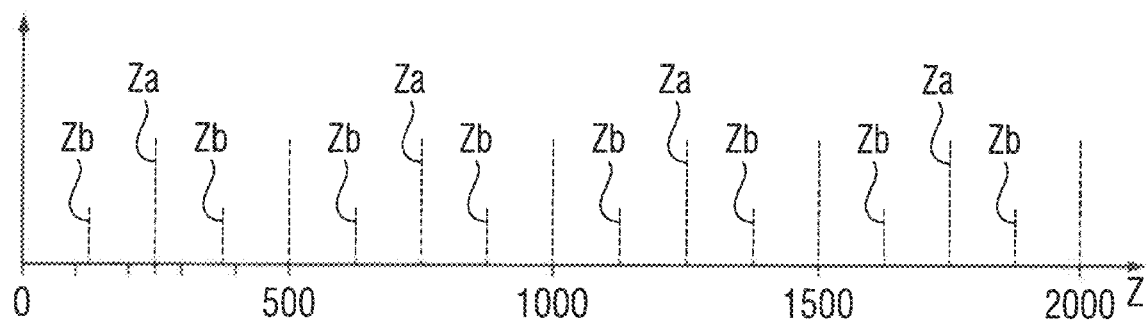
FIG. 8 shows counter readings.

As already mentioned, the analog-digital converter 12 (and thus also the evaluation device 11 as a whole) acquires the raw signal S' solely when the counter 6 transmits a trigger signal TR thereto, wherein the counter 6 outputs the trigger signal TR only in the case of specific counter readings Zb. The raw signal S' is thus acquired only in the case of specific counter readings Zb. The specific counter readings Zb are preferably remote from the boundaries of the successive sections. If, for example in accordance with the depiction in FIG. 8, at a modulo value L of 2000 a total of four sections in each case extend over 500 successive counter readings Z, for example from 0 to 499 etc., the specific counter readings Zb are sufficiently remote from the boundaries of the sections, i.e. sufficiently different from 499 or 500, from 999 or 1000, from 1499 or 1500 and from 1999 or 0. Furthermore, the specific counter readings Zb, as likewise already mentioned, are sufficiently different from the particular counter readings set a. For example, the specific counter readings Zb may be remote from the boundaries of the sections and from the particular counter readings Za by at least 50 or by at least 100. This procedure in particular makes it possible to prevent acquisition of the raw signal in the vicinity of the transient state when modifying the excitation signal. This may in particular be advantageous for EMC reasons. If a section extends from 0 to 499, for example, and a particular counter reading Za Is present at 250, no specific counter reading Zb should be present in the range between 200 and 300. In this case, the corresponding specific counter reading Zb may for example lie at around 125 and/or at around 375. It goes without saying that the stated numerical values are stated only by way of example.

In some cases, it may be appropriate not to acquire the raw signal S' at all in a specific section. As a rule, the raw signal S' is, however, acquired at least once per section. It may, however, also be acquired more than once. In both cases, the number of specific counter readings Zb is an integral multiple of the number M of sections.

If the raw signal S' is acquired more than once per section, it may be particularly appropriate to acquire the raw signal S' twice per section. In this case, it may moreover be appropriate for the raw signal S' to be acquired in each case once approximately in the middle between the respective particular counter reading Za of the respective section and the two boundaries of the respective section. Therefore if, for example, one section extends from 0 to 499 and the particular counter reading Za is around 250, acquisition of the raw signal S' should take place at counter readings Z from around 125 and around 375.

It is possible for all operating parameters of the sensor device 1 to be established as early as during production of the sensor device 1. Alternatively, in accordance with the depiction in FIG. 1, it is possible for the sensor device 1 to have a parameterization input 15 via which various parameters are specifiable for the sensor device 1 after production. The parameters may in particular be specified on commissioning of the sensor device 1. For example, the length of the sections and the number thereof may be specified via the parameterization input 15 for the sensor device 1, consequently thus numbers N and M. Alternatively or in addition, the number k of particular counter readings Za may be specified for the sensor device 1 via the parameterization input 15.

Alternatively or in addition, at least one operating parameter of the exciter device 7 may be specified to the sensor device 1 via the parameterization input 15. These operating parameters may in particular be the values of the excitation signal E to be output by the exciter device 7. These values may for example be saved in the lookup table 9.

Alternatively or in addition, at least one operating parameter of the sensor element 8 may be specified to the sensor device 1 via the parameterization input 15. In accordance with the depiction in FIG. 2, the sensor element 8 may for example have a low-pass filter 16, 17 on the input side and/or on the output side. The excitation signal E may be filtered using the input-side low-pass filter 16. By means of the low-pass filter 17 on the output side, an advance signal I" may be filtered which is generated on the basis of the (optionally already filtered) excitation signal E. Both the input-side and the output-side low-pass filters 16, 17 of the sensor element 8 are analog filters. By means of the parameters for the sensor element 8, it is for example possible to establish filter parameters for the input-side and/or output-side low-pass filters 16, 17.

The essential difference between the input-side and the output-side low-pass filters 16, 17 is that the input-side low-pass filter 16 acts on a signal which is not yet influenced by a mechanically mobile element of the sensor element 8, while the output-side low-pass filter 10 acts on a signal which has already been influenced by the mechanically mobile element of the sensor element 8. The signal filtered by the input-side low-pass filter 16 thus does not yet contain the information about the state of the sensor element 8, whereas the signal filtered by the output-side low-pass filter 17 does contain this information. The advance signal filtered in the output-side low-pass filter 17 is the raw signal S' generated by the sensor element 8.

Alternatively or in addition, at least one operating parameter of the evaluation device 11 may be specified to the sensor device 1 via the parameterization input 15. This is explained in greater detail below.

The operating parameters for the evaluation device 11 may for example be evaluation factors corresponding to the values of the excitation signal E, i.e. the values supplied to the multiplier 13. These values may for example be saved in the lookup table 14. These values for example establish, together with the parameters of a subsequent low-pass filter 18, by means of which the intermediate signals I are filtered, in what way the raw signal S' is further processed, for example whether it undergoes a Fourier transform. In particular, it is for example necessary, for performance of a Fourier transform, for the lookup table 14 to contain suitable cosinusoidally extending values and for the low-pass filter 18 to send a message about a period of the excitation signal E. As a rule, the low-pass filter 18 is a digital filter. The output signal of the low-pass filter 18 is hereinafter designated a further intermediate signal and to this end the reference sign I' is used. The parameter values of the low-pass filter 18 may also be operating parameters for the evaluation device 11, specified to the sensor device 1.

Through evaluation of the further intermediate signals I' in an evaluation element 19, a signal may then be established which corresponds by nature to the resultant sensor signal S. Evaluation in the evaluation element 19 often proceeds by means of a nonlinear evaluation characteristic curve KL. The evaluation element 19 may take the form, for example, of a lookup table. The operating parameters for the evaluation device 11 may be the evaluation characteristic curve KL of the evaluation device 11. The signal, which corresponds in nature with the resultant sensor signal S, is designated below as a provisional sensor signal S".

Finally, a further low-pass filter 20 may be arranged downstream of the evaluation element 19. The low-pass filter 20 is likewise embodied as a digital filter. It may establish, for example over a predetermined number of successive, mutually adjacent but not overlapping periods of the excitation signal E (which may in an individual case be an individual period, but as a rule is a plurality of periods), the resultant sensor signal S as an average of the provisional sensor signals S" established for the periods of the excitation signal E. Since a specific number of signal versions takes place per period, the same number of provisional sensor signals S" is thus also established. If this number is designated k", only every k"-th provisional sensor signal S" is used for the stated averaging. If, moreover, Treq/(LTclk) is integral and the number of values over which averaging is performed in the low-pass filter 20 is equal to Treq/(LTclk), ultimately averaging is thus performed over a request period Treq. This is in particular often advantageous when the sensor element 8 is an acceleration sensor. In this case, the provisional sensor signals S" are namely proportional to the averaged acceleration to be measured over a period of the excitation signal E, and the described averaging gives rise to a value which is proportional to the acceleration averaged over a (1) request period Treq. An acceleration averaged in such a way is often advantageous over an instantaneous acceleration value, because the summation of acceleration values averaged in this way corresponds to the velocity and aliasing effects are furthermore suppressed.

For all the parameterization options, equivalent default settings are also possible. It is possible, for example, instead of the first and second integers N, M, to specify one of these two numbers N, M and the product L of the two numbers N, M. Similar explanations apply to the other possible parameters.

FIG. 9 shows a further sensor device 1. The sensor device 1 is depicted in FIG. 9 in a highly simplified manner. The mode of operation is as explained above in conjunction in particular with FIGS. 2 and 3. Unlike the sensor device 1 of FIG. 1, the sensor device 1 of FIG. 9 has a parameter determination device 21. On the basis of the request frequency freq, the parameter determination device 21 automatically establishes at least one operating parameter of the sensor device 1. This may be any desired (or indeed a plurality of any desired) operating parameters which have been explained above in relation to specification via the parameterization input 15 of the sensor device 1 of FIG. 1.

In accordance with the depiction in FIG. 9, it is possible for the sensor device to have the parameterization input 15 in addition to the parameter determination device 21. In this case, on the one hand a "mixed" procedure is possible, i.e. at least one of the operating parameters is directly specified via the parameterization input 15, while at least one other of the operating parameters is established by the parameter determination device 21 on the basis of the request frequency freq. On the other hand, it is possible to specify the request frequency freq directly as such to the parameter determination device 21 via the parameterization input 15. Specification of the request frequency freq proceeds in this case after production of the sensor device 1, in particular on commissioning of the sensor device 1. As an alternative to direct specification of the request frequency freq, it is possible for the parameter determination device 21 to be connected with the signal connection 2 and automatically to establish the request frequency freq on the basis of the request signal req. This is indicated in FIG. 9 by a dashed line.

As explained above in relation to the parameterizability of the evaluation device 11, it is possible for the evaluation device 11 initially to establish an associated provisional sensor signal S" in each case for one period of the excitation signal E and then to establish the resultant sensor signal S as an average of the provisional sensor signals S'' for a plurality of such periods. An equivalent approach is for the evaluation device 11 to establish a provisional sensor signal S' for in each case a number of counter readings Z, wherein the number of counter readings Z just stated is equal to the modulo value L. Furthermore, it was explained above that the evaluation device 11 initially establishes an intermediate signal I, I' on the basis of the raw signals S' (specifically by means of the analog-digital converter 12 and the evaluation element 19) and establishes a respective provisional sensor signal S'' on the basis of the respective intermediate signal I, I' using a non-linear characteristic curve KL. The latter averaging, i.e. establishing the resultant sensor signal S as an average of the provisional sensor signals S'', preferably proceeds from the last requested resultant sensor signal S. Averaging may in particular proceed in the low-pass filter 20.

To summarize, the present invention thus relates to the following substantive matter:

A sensor device 1 has a clock generator 5, a counter 6, an exciter device 7, a sensor element 8 and an evaluation device 11. A digital request signal req with alternating leading and trailing edges is supplied to the sensor device 1 via a signal connection 2. In response thereto, the sensor device 1 outputs a sensor signal S. The clock generator 5 outputs with a basic frequency fclk a digital basic signal clk, which has alternating leading and trailing edges. The counter 6 increments a counter reading Z modulo of a modulo value L, provided that no leading and/or trailing edge of the request signal req occurs between two leading and/or trailing edges of the basic signal clk. If, on the other hand, such an edge of the request signal req occurs, the counter 6 corrects the counter reading Z by the distance to the next one of a number of particular counter readings Za. The exciter device 7 outputs an excitation signal E to the sensor element 8. The value of the excitation signal E is determined by the exciter device 7 on the basis of the respective counter reading Z or a value derived therefrom. The sensor element 8 outputs a raw signal S' on the basis of the excitation signal E, which raw signal S' is supplied to the evaluation device 11. The evaluation device 11 determines, on the basis of the respective counter reading Z or a value derived therefrom, whether it acquires the raw signal S' and in what way it takes account of the respectively acquired raw signal S' when establishing the sensor signal S.

The present invention has many advantages. In particular, dead time may be kept virtually perfectly constant. The sensor device 1 is of very simple construction. An analog-operating phase-locked loop (PLL) is not necessary.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by letters patent is set forth in the appended claims and includes equivalents of the elements recited therein:

1. A sensor device, comprising:
   a sensor element,
   a signal connection receiving from a higher-level device a digital request signal with alternating leading and trailing edges, and outputting to the higher-level device in response the received digital request signal via the signal connection or via another signal connection a resultant sensor signal,
   a clock generator outputting a digital basic signal with a basic frequency and alternating leading and trailing edges,
   a counter receiving the digital basic signal and the digital request signal and outputting a counter reading,
   wherein, when the digital request signal has no leading edge or trailing edge located between two directly successive leading or trailing edges of the digital basic signal, the counter increments the counter reading modulo a modulo value,
   wherein, when the digital request signal has a leading or trailing edge located between two directly successive leading or trailing edges of the digital basic signal, the counter corrects the counter reading, prior to or after incrementation of the counter reading, by a distance between the counter reading and a particular counter reading that is closest to the counter reading, with the particular counter reading belonging to a true subset of possible counter readings,
   an exciter device receiving the counter reading or a value derived therefrom; determining, based on the respective counter reading or the value derived therefrom a value of an excitation signal; and outputting the excitation signal to the sensor element which outputs a raw signal based on the excitation signal, and
   an evaluation device receiving the raw signal and the counter reading or the value derived therefrom and determining, based on the counter reading or the value derived therefrom, whether to capture the raw signal and how to take the captured raw signal into account when determining the resultant sensor signal.

2. The sensor device of claim 1, wherein a number of particular counter readings is 1.

3. The sensor device of claim 1, wherein a number of particular counter readings is greater than 1.

4. The sensor device of claim 1, wherein
   the excitation signal outputted by the exciter device to the sensor element has, for sequential counter readings, a constant value during successive, internally coherent sections of counter readings,
   the successive, internally coherent sections of counter readings have at least approximately an identical number of counter readings,
   the number of sections is equal to or an integer multiple of a number of the particular counter readings, and
   the particular counter readings are located approximately at a center of a respective section.

5. The sensor device of claim 4, wherein the evaluation device captures the raw signal exclusively for specific counter readings.

6. The sensor device of claim 5, wherein the specific counter readings are remote from boundaries of the successive, internally coherent sections.

7. The sensor device of claim 4, further comprising a parameterization input configured to specify first and second integers after production or commissioning of the sensor device, wherein
   the modulo value is equal to a product of a first and a second integer, the first integer is equal to a number of successive counter readings during which the excitation signal has a constant value, and the second integer is equal to a number of sections of successive counter readings during which the excitation signal has a constant value.

8. The sensor device of claim 1, further comprising a parameterization input configured to specify the number of the particular counter readings after production or commissioning of the sensor device.

9. The sensor device of claim 1, further comprising a parameterization input configured to specify at least one operating parameter of the exciter device or of the sensor element or of the evaluation device, or of a combination thereof, after production or commissioning of the sensor device.

10. The sensor device of claim 1, further comprising a parameter determination device configured to automatically establish an operating parameter of the sensor device based on a request frequency.

11. The sensor device of claim 10, further comprising a parameterization input configured to specify a request frequency after production or commissioning of the sensor device.

12. The sensor device of claim 10, wherein the digital request signal is supplied to the parameter determination device which automatically establishes a request frequency based on the digital request signal.

13. The sensor device of claim 1, wherein the excitation signal is periodic with the modulo value with respect to the sequence of the counter readings and oscillates at a fundamental frequency or at a higher harmonic, or the fundamental frequency or the higher harmonic determines at least a dominant portion of the excitation signal.

14. The sensor device of claim 1, wherein the evaluation device determines, starting from a most recently requested resultant sensor signal, a provisional sensor signal for a number of counter readings, with the number of counter readings being equal to the modulo value, determines the provisional sensor signal by initially determining an intermediate signal based on the raw signals by using a non-linear characteristic curve, and determines the resultant sensor signal as an average value of provisional sensor signals determined since the most recently requested resultant sensor signal.

15. The sensor device of claim 1, wherein the sensor element is a capacitive sensor element, in particular a capacitive position encoder or a capacitive acceleration sensor.

* * * * *